(12) United States Patent
Sone et al.

(10) Patent No.: US 6,184,044 B1
(45) Date of Patent: Feb. 6, 2001

(54) THIN FILM CAPACITOR INCLUDING PEROVSKITE-TYPE OXIDE LAYERS HAVING COLUMNAR STRUCTURE AND GRANULAR STRUCTURE

(75) Inventors: Shuji Sone; Yoshitake Kato, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/208,411

(22) Filed: Dec. 10, 1998

(30) Foreign Application Priority Data

Dec. 10, 1997  (JP) .................................................... 9-340163

(51) Int. Cl.[7] .................................................. H01L 21/00
(52) U.S. Cl. .................................. 438/3; 438/3; 438/238; 438/240; 438/250; 438/256; 438/381; 438/393; 438/399; 275/200
(58) Field of Search ............................... 438/3, 240, 250, 438/256, 238, 381, 393, 399; 257/200

(56) References Cited

U.S. PATENT DOCUMENTS

| 5,663,089 | * | 9/1997 | Tomozawa et al. | 427/576 |
| 5,932,905 | * | 8/1999 | O'Bryan, Jr. et al. | 257/298 |
| 5,943,547 | * | 8/1999 | Yamamichi et al. | 438/3 |
| 5,986,301 | * | 11/1999 | Fukushima et al. | 257/306 |

FOREIGN PATENT DOCUMENTS

| 6-21337 | 1/1994 | (JP) . |
| 8-017939 | 1/1996 | (JP) . |
| 9-139480 | 5/1997 | (JP) . |
| 10-12832 | 1/1998 | (JP) . |
| 8-181358 | 1/1998 | (JP) . |
| 10-050960 | 2/1998 | (JP) . |
| 10-173140 | 6/1998 | (JP) . |
| 10-200069 | 7/1998 | (JP) . |
| 10-321809 | 12/1998 | (JP) . |
| 10-341010 | 12/1998 | (JP) . |

OTHER PUBLICATIONS

Eiji Fujii et al., "Preparation of $PbTiO_3$ thin films by plasma–enhanced metalorganic chemical vapor deposition", Appl. Phys. Lett. 65(3), pp. 365, Jul. 18, 1994.

Takaaki Kawahara et al., "Influence of Buffer Layers and Barrier Metals on Properties of $(Ba,Sr)TiO_3$ Films Prepared by Liquid Source Chemical Vapor Deposition", Jpn. J. Appl. Phys. vol. 36(1997), pp. 5874–5878, Sep. 1997.

Takaaki Kawahara et al. "Surface Morphologies and Electrical Properties of $(Ba,Sr)TiO_3$ Films Prepared by Two–Step Deposition of Liquid Source Chemical Vapor Deposition", Jpn. J. Appl.: Phys. vol. 34(1995) pp. 5077–5082, Sep. 1995.

* cited by examiner

*Primary Examiner*—Richard Elms
*Assistant Examiner*—Pho Luu
(74) *Attorney, Agent, or Firm*—Sughrue, Mion, Zinn, Macpeak & Seas, PLLC

(57) ABSTRACT

The present invention relates to a thin film capacitor that may be used as a stacked capacitor in a memory cell. In a thin film capacitor including a high dielectric constant layer sandwiched by two electrode layers, the high dielectric constant layer includes at least one perovskite-type oxide layer having a columnar structure and at least one perovskite-type oxide layer having a granular structure.

18 Claims, 6 Drawing Sheets

THIN FILM CAPACITOR INCLUDING PEROVSKITE-TYPE OXIDE LAYERS HAVING COLUMNAR STRUCTURE AND GRANULAR STRUCTURE

BACKGROUND OF THE INVENTION

1. Field of the Invention

The present invention relates to a thin film capacitor used as a stacked capacitor in a memory cell of a dynamic random access memory (DRAM) device.

2. Description of the Related Art

Generally, in a DRAM cell, a stacked capacitor is formed by a lower electrode layer, an upper electrode layer and an insulating layer. Particularly, in a 1 Gbit DRAM device, a perovskite-type oxide layer is adopted as the insulating layer therebetween to improve the dielectric constant, the leakage current characteristics (the insulating characteristics) and the chemical stability characteristics. The perovskite-type oxide layer is made of oxide represented by $ABO_3$ where A includes at least one of metals belonging to II-group or Pb and B includes at least one of metals belonging to IV-group. For example, $ABO_3$ is $(Ba,Sr)TiO_3$ (BST) and $(Pb,Zr)TiO_3$.

The perovskite-type oxide layer is formed by using a sputtering process, a chemical vapor deposition (CVD) process or a sol-gel process. In view of the step coverage characteristics, the CVD process is preferably used.

A first prior art thin film capacitor includes a perovskite-type oxide layer having a columnar structure (see: Eiji Fujii et al., "Preparation of $PbTiO_3$ thin films by plasma-enhanced metalorganic chemical vapor deposition", Appl. Phys. Lett. 6513, pp. 365–367, Jul. 18, 1994). This will be explained later in detail.

In the first prior art thin film capacitor, however, the leakage current is increased. As a result, the insulating characteristics of the thin film capacitor are deteriorated, and also the breakdown voltage characteristics of the thin film capacitor are deteriorated.

A second prior art thin film capacitor includes a perovskite-type oxide layer having a granular structure (see: Takaaki Kawahara et al., "Influence of Buffer Layers and Barrier Metals on Properties of (Ba, Sr) Ti $O_3$ Films Prepared by Liquid Source Chemical Vapor Deposition", Jpn. J. Appl. Phys. Vol. 36 (1997), pp. 5874–5878, September 1997, and Takaaki Kawahara et al., "Surface Morphologies and Electrical Properties of (Ba, Sr)Ti $O_3$ Films Prepared by Two-Step Deposition of Liquid Source Chemical Vapor Deposition", Jpn. J. Appl. Phys. Vol. 34 (1995), pp. 5077–5082, September (1995). This also will be explained later in detail.

In the second prior art thin film capacitor, however, the dielectric constant is reduced.

SUMMARY OF THE INVENTION

It is an object of the present invention to provide a thin film capacitor including a perovskite-type oxide layer having a high dielectric constant as well as a low leakage current density which invites excellent insulating and breakdown voltage characteristics.

According to the present invention, in a thin film capacitor including a high dielectric constant layer sandwiched by two electrode layers, the high dielectric constant layer includes at least one perovskite-type oxide layer having a columnar structure and at least one perovskite-type oxide layer having a granular structure.

BRIEF DESCRIPTION OF THE DRAWINGS

The present invention will be more clearly understood from the description as set below, as compared with the prior art, with reference to the accompanying drawings, wherein.

DESCRIPTION OF THE PREFERRED EMBODIMENTS

Before the preferred embodiments, prior art thin film capacitors will be explained with references to FIGS. 1 and 2.

Figure 1:
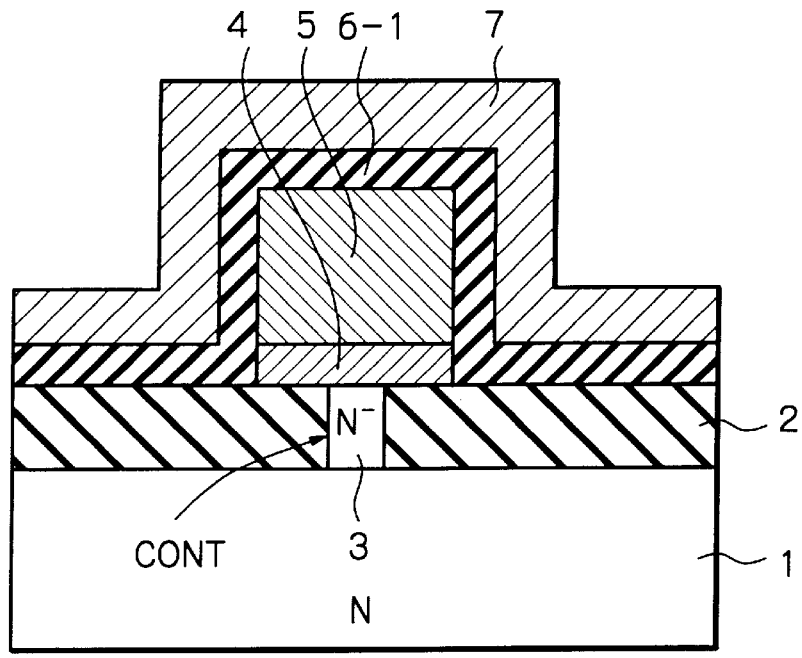
FIG. 1 is a cross-sectional diagram illustrating a first prior art thin film capacitor.

In FIG. 1, which illustrates a first prior art thin film capacitor, reference numeral 1 designates an N-type monocrystalline silicon substrate, and 2 designates an insulating layer made of silicon oxide. Also, formed in the insulating layer 2 is a contact hole CONT in which an N-type impurity doped polycrystalline silicon plug 3 is buried.

A silicon diffusion preventing conductive layer or a barrier layer 4 made of refractory metal such as TiN and a lower electrode layer 5 made of noble metal such as Ru are formed on the polycrystalline silicon plug 3. In this case, the barrier layer 4 avoids the reaction between the silicon of the polycrystalline silicon plug 3 and the ruthenium of the lower electrode layer 5.

Also, a high dielectric constant layer 6-1 made of perovskite-type oxide having a columnar structure is formed to cover the lower electrode layer 5.

Further, an upper electrode layer 7 is formed on the high dielectric constant layer 6-1.

The high dielectric constant layer 6-1 made of Pb $TiO_3$ is formed by using a plasma-enhanced metalorganic chemical vapor deposition (MOCVD) process (see: Eiji Fujii et al., "Preparation of $PbTiO_3$ thin films by plasma-enhanced metalorganic chemical vapor deposition", Appl. Phys. Lett. 6513), pp. 365–367, Jul. 18, 1994). The high dielectric constant layer 6-1 can have a high dielectric constant.

In the thin film capacitor of FIG. 1, however, since the high dielectric constant layer 6-1 has a columnar structure where grain boundaries are formed perpendicular to the growth direction of the high dielectric constant layer 6-1, the grain boundaries serve as leakage current paths. Particularly, in a 1Gbit DRAM device, the $SiO_2$ equivalent thickness $t_{eq}$ needs to be less than 30 nm. Therefore, in such a DRAM device, the leakage current is increased. As a result, the insulating characteristics of the thin film capacitor are deteriorated, and also the breakdown voltage characteristics of the thin film capacitor are deteriorated.

Figure 2:
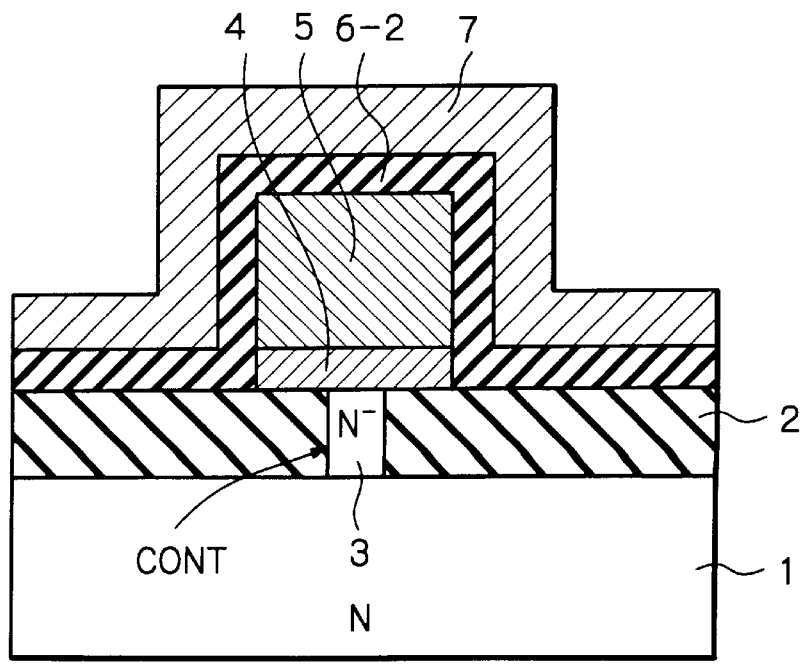
FIG. 2 is a cross-sectional diagram illustrating a second prior art thin film capacitor.

In FIG. 2, which illustrates a second prior art thin film capacitor, a high dielectric constant layer 6-2 made of perovskite-type oxide having a granular structure is provided instead of the dielectric constant layer 6-1 made of perovskite-type oxide having a columnar structure of FIG. 1. For example, the high dielectric constant layer 6-2 is formed by a two-step Liquid Source CVD process (see: Takaaki Kawahara et al., "Influence of Buffer Layers and Barrier Metals on Properties of (Ba, Sr) TiO$_3$ Film Prepared by Liquid Source chemical VaporReposition", Jpn. J. Appl. Phys. Vol. 36 (1997), pp. 5874–5878, September 1997, and Takaaki Kawahara et al., "Surface Morphologies and Electrical Properties of (Ba, Sr) TiO$_3$ Films Prepared by Two-Step Deposition of Liquid Source Chemical vapor Deposition", Jpn. J. Appl. Phys. Vol. 34 (1995), pp. 5077–5082, September 1995). That is, an about 5 mm thick (Ba, Sr) TiO$_3$, (BST) layer is deposited at a substrate temperature of 420° C. and is crystallized by a N$_2$ gas annealing process. Then, a second BST layer is deposited thereon at a substrate temperature of 420° C. and is crystallized by a N$_2$ gas annealing process to obtain a total thickness of 30 nm. In this case, the component (Ba, Sr) of the first BST layer is larger than that of the second BST layer. Thus, the SiO$_2$ equivalent thickness $t_{eq}$ is about 0.7 nm, the dielectric constant $\in_r$ is about 160, and the leakage current $J_L$ is about $1\times10^{-8}$ A/cm$^2$ at +1.1 V. Note that the latter document includes surface morphology pictures showing the granular structure. Thus, the second prior art thin film capacitor can obtain a small leakage current. Therefore, the insulating and breakdown voltage characteristics of the thin film capacitor can be enhanced.

In the thin film capacitor of FIG. 2, however, since the SiO$_2$ equivalent thickness $t_{eq}$ needs to be lower than 0.4 nm in a 4 Gbit DRAM device or the like, the dielectric constant $\in_r$ is further reduced.

Figure 3:
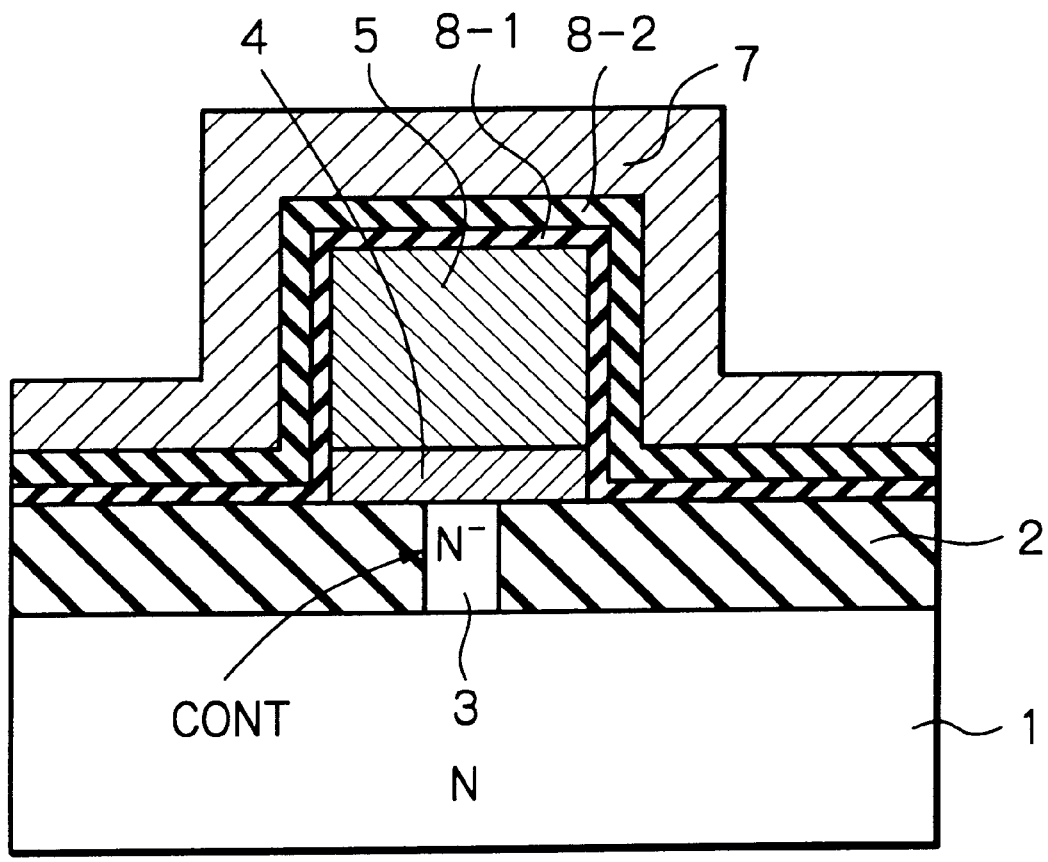
FIG. 3 is a cross-sectional diagram illustrating a first embodiment of the thin film capacitor according to the present invention.

In FIG. 3, which illustrates a first embodiment of the present invention, an about 5 nm thick high dielectric constant layer 8-1 made of perovskite-type oxide having a granular structure and an about 80 nm thick high dielectric constant layer 8-2 made of perovskite-type oxide having a columnar structure are provided instead of the high dielectric constant layer 6-1 of FIG. 1 and the high dielectric constant layer 6-2 of FIG. 2.

As stated above, since high dielectric constant layer 8-2 is made of perovskite-type oxide having a columnar structure where grain boundaries are perpendicular to the growth direction, gaps included in the high dieclectric constant layer 8-2 serve as leakage current paths. In addition, since the surface roughness of the columnar structure is large in accordance with the grain size thereof, so that the interface of the upper electrode layer 7 also becomes rough, the polarity dependency of the leakage current becomes large. That is, the leakage current is larger where a positive voltage is applied to the lower electrode layer 5 and a negative voltage is applied to the upper electrode layer 7 than where a positive voltage is applied to the upper electrode layer 7 and a negative voltage is applied to the lower electrode layer 5.

On the other hand, since the high dielectric constant layer 8-1 is made of perovskite-type oxide having a granular structure where grains of irregular sizes are randomly arranged in a high density state and the directions of grain boundaries are random, leakage current paths are hardly generated in the granular structure. In addition, since the surface of the granular structure is flat, the polarity dependency of the leakage current is small. Thus, the advantage of the column structure over the granular structure is that the dielectric constant is high. On the other hand, the advantage of the granular structure over the column structure is that the leakage current is small, the insulating characteristics and the breakdown voltage characteristics are excellent.

Therefore, the combination of the high dielectric constant layers 8-1 and 8-2 exhibit a high dielectric constant as well as a low leakage current density which invites excellent insulating and breakdown voltage characteristics.

The high dielectric constant layers 8-1 and 8-2 are made of perovskite-type oxide represented by

$$A_m B_n O_3$$

where A is II-group metal such as Sr, Ba or Ba, or Pb;

B is IV-group metal such as Ti or Zr; and m and n are positive values.

Also, the metal A can include two kinds of metals (X, Y)$_m$B$_n$O$_3$ such as (Ba, Sr), Ti$_n$O$_3$.

Figure 4A:
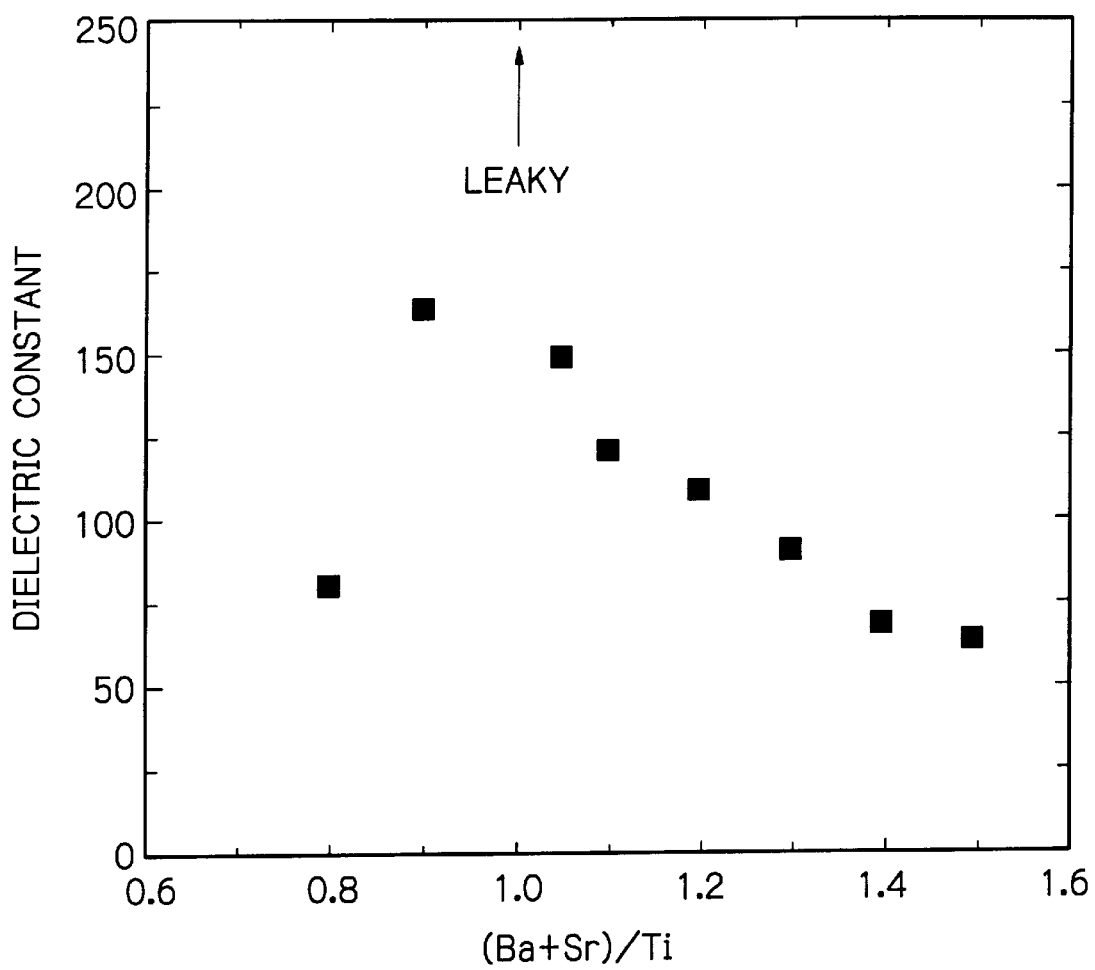
FIG. 4A is a graph showing the dielectric constant characteristics of the perovskite-type oxide layer having a granular structure of FIG. 3.
Figure 4B:
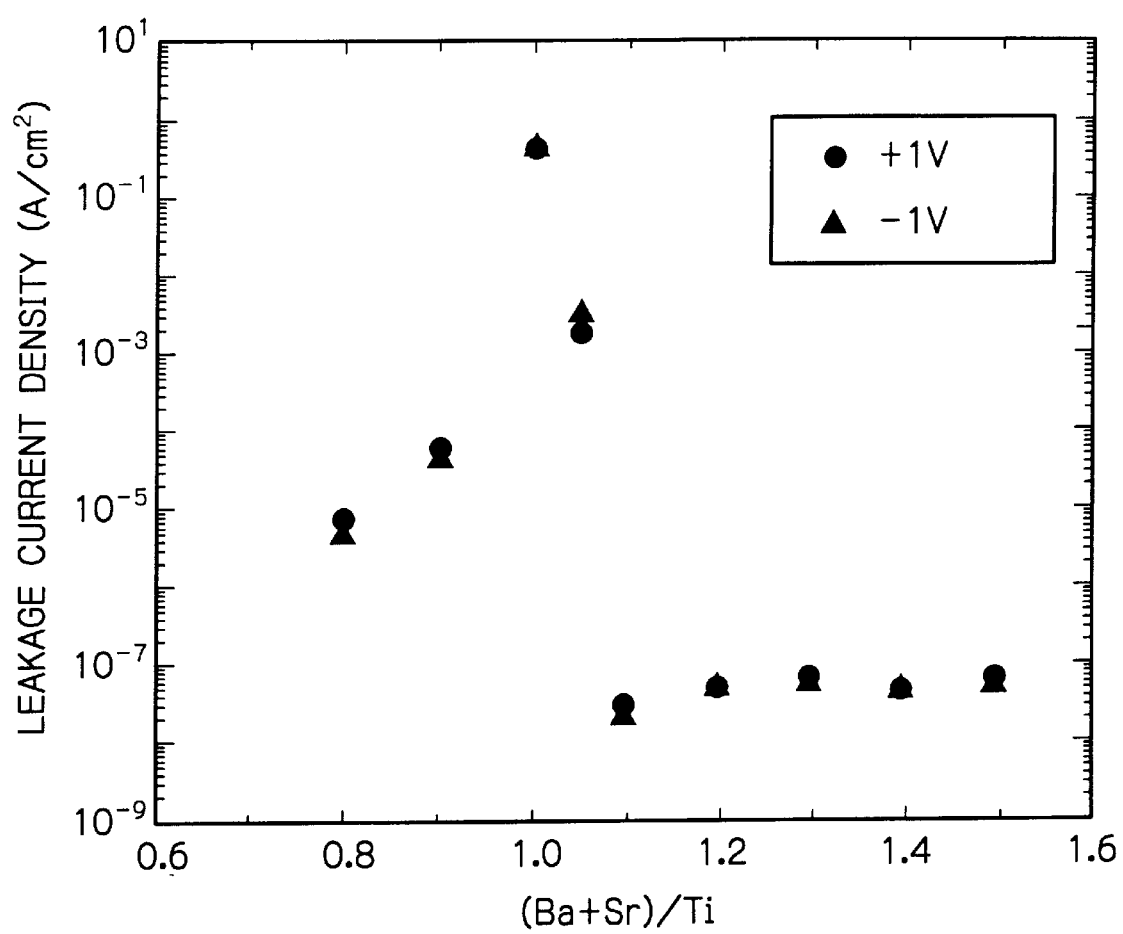
FIG. 4B is a graph showing the leakage current density characteristics of the perovskite-type oxide layer having a granular structure of FIG. 3.

Further, if the high dielectric constant layer 8-1 is made of about 30 nm thick (Ba, Sr) TiO$_3$, for example, the dielectric constant and the leakage current density are as shown in FIGS. 4A and 4B, respectively. That is, as shown in FIG. 4B when the composition ratio of (Ba+Sr)/Ti is approximately from 1.1 to 1.5, the leakage current characteristics of the granular structure can be remarkably improved. In this case, note that the low dielectric constant of the granular structure as shown in FIG. 4A can be compensated for by the columnar structure of the high dielectric constant layer 8-2.

The manufacturing steps of the thin film capacitor of FIG. 3 will be explained next.

First, an N-type monocrystalline silicon substrate 1 is thermally oxidized to form an about 600 nm thick insulating layer 2 made of silicon oxide. Then, a contact hole CONT is perforated in the insulating layer 2. Then, an about 1 $\mu$m thick polycrystalline silicon layer is deposited on the entire surface by a CVD process, and phosphorus ions are diffused into the polycrystalline silicon layer to reduce the resistance thereof.

Next, the polycrystalline silicon layer is etched back by a reactive ion etching (RIE) process using chlorine gas, and as a result, N-type polycrystalline silicon plug 3 is buried in the contact hole CONT.

Next, an about 20 nm thick TiN layer and an about 500 nm thick Ru layer are sequentially deposited by a reactive DC sputtering process. The TiN layer and the Ru layer are patterned by an electron cyclotron resonance (ECR) plasma etching process using a mixture of chlorine gas and oxygen gas to form a barrier layer 4 and a lower electrode layer 5 which have a pattern width of about 0.4 $\mu$m.

Figure 5:
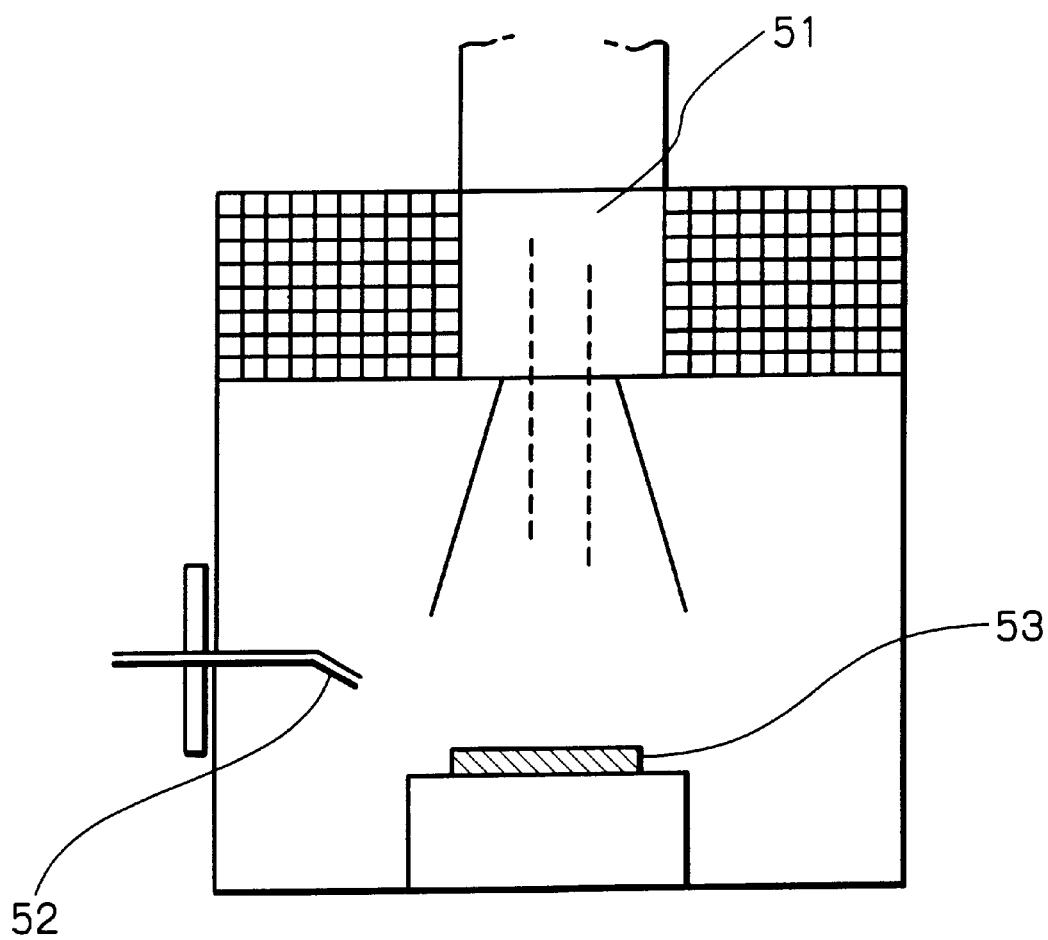
FIG. 5 is a diagram illustrating an electron cyclotron resonance chemical vapor deposition (ECR-CVD) apparatus used for manufacturing the thin film capacitor of FIG. 3.

Next, a wafer which forms the insulating layer 2, the polycrystalline silicon plug 3, the barrier layer 4 and the lower electrode layer 5 on the silicon substrate 1 is put in an ECR-CVD apparatus as illustrated in FIG. 5 where an ECR generating section 51 for generating oxygen plasma and an injection nozzle 52 for injecting organic metal source or the like are provided. Note that reference numeral 53 in FIG. 5 designates the above-mentioned wafer. As a result, an about 5 nm thick amorphous BST layer is deposited on the entire surface at a substrate temperature of about 100° C. In this case, the ratio of (Ba+Sr)/Ti is about 1.1 to 1.5, and the ratio of Ba/(Ba+Sr) is less than about 0.5. Then, the wafer is removed from the ECR-CVD apparatus. Then, an annealing operation using N$_2$ gas at a temperature of about 600° C. is performed upon the wafer, so that the high dielectric constant layer 8-1 made of perovskite-type oxide having a granular structure is formed.

Next, the wafer is again put in the ECR-CVD apparatus as illustrated in FIG. 5. As a result, an about 80 nm thick BST layer is deposited on the entire surface at a substrate temperature of about 550° C. In this case, the ratio of (Ba+Sr)/Ti is smaller than that of the high dielectric constant layer 8-1, and the ratio of Ba/(Ba+Sr) is less than about 0.5. Then, the wafer is removed from the ECR-CVD apparatus. Thus, a high dielectric constant layer 8-2 made of perovskite-type oxide having a columnar structure is formed. Note that since the step coverage rate of BST is about 40 percent, the thickness of the high dielectric constant layer 8-2 on the sidewall of the lower electrode layer 5 is about 30 nm.

Finally, an about 50 nm thick upper electrode layer 7 made of Ru is deposited on the entire surface by a sputtering process.

In the thin film capacitor of FIG. 3, when the ratios of (Ba+Sr)/Ti and Ba/(Ba+Sr) of the high dielectric constant layer 8-1(granular structure) were 1.2 and 0.4, respectively, and the ratios of (Ba+Sr)/Ti and Ba/(Ba+Sr) of the high dielectric constant layer 8-2 (columnar structure) were 0.9 and 0.4, respectively, the dielectric constant was 450, the leakage current density $J_L$ was $2 \times 10^{-8}$ A/cm$^2$ at a+1V, and the dielectric loss was less than 1 percent. Also, the dependency of the leakage current density was not observed. Thus, excellent electrical characteristics were obtained.

In the thin film capacitor of FIG. 3, when the ratios of (Ba+Sr)/Ti of the high dielectric constant layer 8-1 (granular structure) was 1.1 were 1.2 and 0.4, respectively, and the ratios of (Ba+Sr)/Ti and Ba/(Ba+Sr) of the high dielectric constant layer 8-2 (columnar structure) were 0.97 and 0.5, respectively, the dielectric constant was 450, the leakage current density $J_L$ was $3 \times 10^{-8}$ A/cm$^2$ at a+1V, and the dielectric loss was less than 1 percent. Also, the dependency of the leakage current density upon voltage polarity was not observed. Thus, excellent electric a characteristics were obtained.

Figure 6:
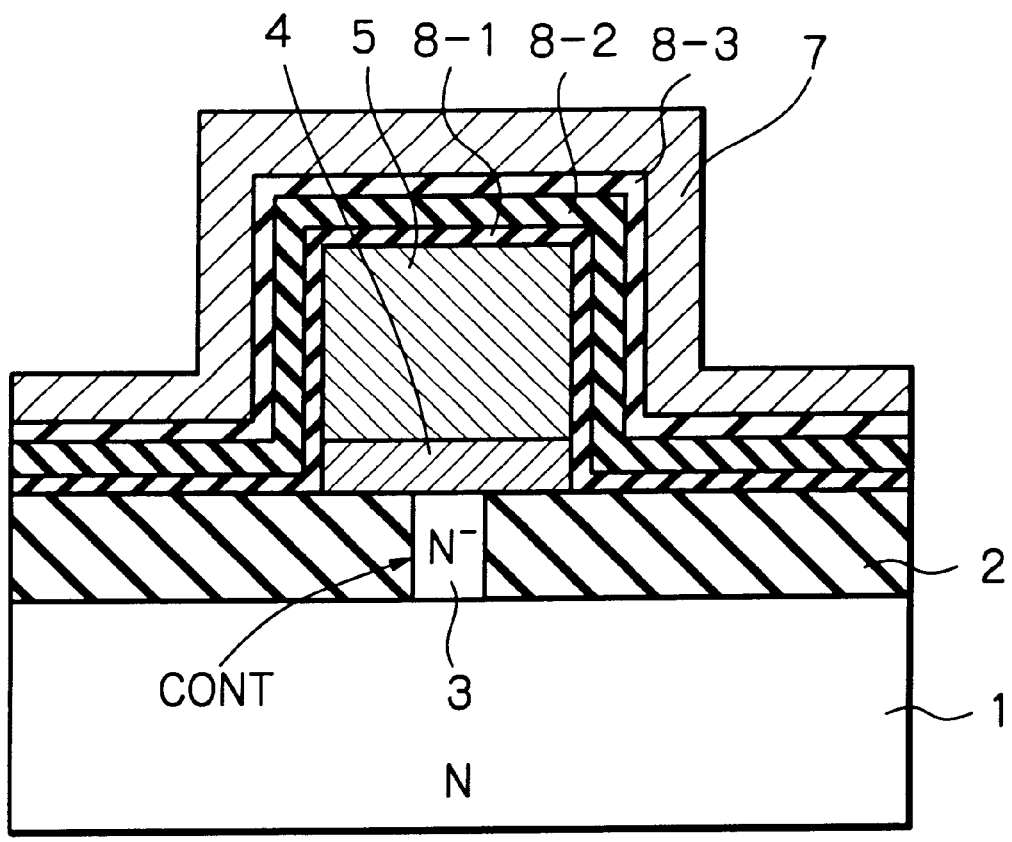
FIG. 6 is a cross-sectional diagram illustrating a second embodiment of the thin film capacitor according to the present invention.

In FIG. 6, which illustrates a second embodiment of the present invention, a high dielectric constant layer 8-3 made of perovskite-type oxide having a granular structure is added to the elements of FIG. 3. In FIG. 6, note that the high dielectric constant layers 8-1, 8-2 and 8-3 are about 5 nm, 20 nm and 5 nm thick, respectively.

The manufacturing steps of the thin film capacitor of FIG. 6 will be explained next.

The insulating layer 2, the polycrystalline silicon plug 3, the barrier layer 4 and the lower electrode layer 5 are formed in the same way as in the first embodiment.

Next, a wafer which forms the insulating layer 2, the polycrystalline silicon plug 3, the barrier layer 4 and the lower electrode layer 5 on the silicon substrate 1 is put in the ECR-CVD apparatus as illustrated in FIG. 5. As a result, an about 5 nm thick amorphous BST layer is deposited on the entire surface at a substrate temperature of about 100° C. In this case, the ratio of (Ba+Sr)/Ti is about 1.1 to 1.5, and the ratio of Ba/(Ba+Sr) is less than about 0.5.

Then, the wafer is removed from the ECR-CVD apparatus. Then, an annealing operation using N$_2$ gas at a temperature of about 600° C. is performed upon the wafer, so that a high dielectric constant layer 8-1 made of perovskite-type oxide having a granular structure is formed.

Next, the wafer is again put in the ECR-CVD apparatus as illustrated in FIG. 5. As a result, an about 20 nm thick BST layer is deposited on the entire surface at a substrate temperature of about 550° C. In this case, the ratio of (Ba+Sr)/Ti is smaller than that of the high dielectric constant layer 8-1, and the ratio of Ba/(Ba+Sr) is less than about 0.5. Then, the wafer is removed from the ECR-CVD apparatus. Thus, a high dielectric constant layer 8-2 made of perovskite-type oxide having a columnar structure is formed. Note that since the step coverage rate of BST is about 40 percent, the thickness of the high dielectric constant layer 8-2 on the sidewall of the lower electrode layer 5 is about 10 nm.

Next, the wafer is again put in the ECR-CVD apparatus as illustrated in FIG. 5. As a result, an about 5 nm thick amorphous BST layer is deposited on the entire surface at a substrate temperature of about 100° C. In this case, the ratio of (Ba+Sr)/Ti is about 1.1 to 1.5, and the ratio of Ba/(Ba+Sr) is less than about 0.5.

Then, the wafer is removed from the ECR-CVD apparatus Then, an annealing operation using N$_2$ gas at a temperature of about 600° C. is performed upon the wafer, so that a high dielectric constant layer 8-3 made of perovskite-oxide having a granular structure is formed.

Finally, an about 200 nm thick upper electrode layer 7 made of Ru is deposited on the entire surface by a sputtering process.

In the thin film capacitor of FIG. 6, when the ratios of (Ba+Sr)/Ti and Ba/(Ba+Sr) of the high dielectric constant layer 8-1 (granular structure) were 1.2 and 0.3, respectively the ratios of (Ba+Sr)/Ti and Ba/(Ba+Sr) of the high dielectric constant layer 8-2 (columnar structure) were 0.97 and 0.5, respectively, the ratios of (Ba+Sr)/Ti and Ba/(Ba+Sr) of the high dielectric constant layer 8-3 (granular structure) were 1.2 and 0.3, respectively, the dielectric constant was 450, the leakage current density $J_L$ was $5 \times 10^{-8}$ A/cm$^2$ at a+1V,and the dielectric loss was less than 1 percent. Also, the dependency of the leakage current density upon voltage polarity was not observed. Thus, excellent electrical characteristics were obtained.

In the above-mentioned embodiments, if the ratio of (Ba+Sr)/Ti of the columnar structure is not less than that of the granular structure, it was found that the dielectric constant of the thin film capacitor is reduced.

Also, the above-mentioned high dielectric constant layers made of perovskite-type oxide can be grown by using another sputtering process or sol-gel process.

Further, the high dielectric constant layers can be made of $A_m B_n O_3$ where A includes at least one of Ca, Sr, Ba belonging to II-group metal and Pb and B includes at least one of Ti and Zr belonging to IV-group metal.

Additionally, in the thin film capacitor according to the present invention, two or more perovskite-type oxide layers having a columnar structure and three or more provskite-type oxide layers having a granular structure can be provided.

As explained hereinabove, according to the present invention, the thin film capacitor made of perovskite-type oxide can exhibit a high dielectric constant as well as a low leakage current density which invites excellent insulating and breakdown voltage characteristics.

What is claimed is:
1. A thin film capacitor comprising:
two electrode layers; and
a high dielectric constant layer, sandwiched by said electrode layers, said high dielectric constant layer comprising at least one perovskite-type oxide layer having a columnar structure and at least one perovskite-type oxide layer having a granular structure.
2. The capacitor as set forth in claim 1, wherein said high dielectric constant layer is made of:

where A includes at least one of metals belonging to II-group or Pb;
B includes at least one metal belonging to IV-group; and
m and n are positive values.

3. The capacitor as set forth in claim 2, wherein a ratio m/n in $A_mB_nO_3$ of said perovskite-type oxide layer having said granular structure is about 1.1 to 1.5.

4. The capacitor as set forth in claim 3, wherein a ratio m/n in $A_mB_nO_3$ of said perovskite-type oxide layer having said columnar structure is smaller than the ratio m/n in $A_mB_nO_3$ of said perovskite-type oxide layer having said granular structure.

5. A thin film capacitor comprising:
   two electrode layers; and
   a high dielectric constant layer, sandwiched by said electrode layers, said high dielectric constant layer comprising at least one perovskite-type oxide layer having a columnar structure and at least one perovskite-type oxide layer having a granular structure,
   said high dielectric constant layer is made of $(Ba, Sr)_mTi_nO_3$, where m and n are positive values.

6. The capacitor as set forth in claim 5 wherein a ratio m/n in $(Ba, Sr)_mTi_nO_3$ of said perovskite-type oxide layer having said granular structure is about 1.1 to 1.5.

7. The capacitor as set forth in claim 6, wherein a ratio m/n in $(Ba, Sr)_mTi_nO_3$ of said perovskite-type oxide layer having said columnar structure is smaller than the ratio m/n in $(Ba, Sr)_mTi_nO_3$ of said perovskite-type oxide layer having said granular structure.

8. The capacitor as set forth in claim 5, wherein a ratio of $Ba/(Ba+Sr)$ in $(Ba, Sr)_mTi_nO_3$ is less than about 0.5.

9. A thin film capacitor comprising:
   a monocrystalline silicon substrate;
   an insulating layer formed on said monocrystalline silicon substrate, a contact hole being perforated in said insulating layer;
   a polycrystalline silicon plug buried in said contact hole of said insulating layer;
   a barrier layer formed on said polycrystalline silicon plug;
   a lower electrode layer formed on said barrier layer;
   a high dielectric constant layer, formed on said lower electrode layer, said high dielectric constant layer comprising at least one perovskite-type oxide layer having a columnar structure and at least one perovskite-type oxide layer having a granular structure; and
   an upper electrode layer formed on said high dielectric constant layer.

10. The capacitor as set forth in claim 9, wherein said high dielectric constant layer is made of:

$A_mB_nO_3$ where A includes at least one of metals belonging to II-group or Pb;
    B includes at least one metal belonging to IV-group; and
    m and n are positive values.

11. The capacitor as set forth in claim 10, wherein a ratio m/n in $A_mB_nO_3$ of said perovskite-type oxide layer having said granular structure is about 1.1 to 1.5.

12. The capacitor as set forth in claim 11, wherein a ratio m/n in $A_mB_nO_3$ of said perovskite-type oxide layer having said columnar structure is smaller than the ratio m/n in $A_mB_nO_3$ of said perovskite-type oxide layer having said granular structure.

13. A thin film capacitor comprising:
    a monocrystalline silicon substrate;
    an insulating layer formed on said monocrystalline silicon substrate, a contact hole being perforated in said insulating layer;
    a polycrystalline silicon plug buried in said contact hole of said insulating layer;
    a barrier layer formed on said polycrystalline silicon plug;
    a lower electrode layer formed on said barrier layer;
    a high dielectric constant layer, formed on said lower electrode layer, said high dielectric constant layer comprising at least one perovskite-type oxide layer having a columnar structure and at least one perovskite-type oxide layer having a granular structure; and
    an upper electrode layer formed on said high dielectric constant layer,
    said high dielectric constant layer is made of $(Ba, Sr)_mTi_nO_3$, where m and n are positive values.

14. The capacitor as set forth in claim 13, wherein a ratio m/n in $(Ba, Sr)_mTi_nO_3$ of said perovskite-type oxide layer having said granular structure is about 1.1 to 1.5.

15. The capacitor as set forth in claim 14, wherein a ratio m/n in $(Ba, Sr)_mTi_nO_3$ of said perovskite-type oxide layer having said columnar structure is smaller than the ratio m/n in $(Ba, Sr)_mTi_nO_3$ of said perovskite-type oxide layer having said granular structure.

16. The capacitor as set forth in claim 13, wherein a ratio of $Ba/(Ba+Sr)$ in $(Ba, Sr)_mTi_nO_3$ is less than about 0.5.

17. A method for manufacturing a thin film capacitor including two electrode layers and a high dielectric constant layer, sandwiched by said electrode layers, said high dielectric constant layer comprising at least one perovskite-type oxide layer having a columnar structure and at least one perovskite-type oxide layer having a granular structure, comprising the steps of:
    forming an amorphous $A_mB_nO_3$ layer; and
    annealing said amorphous $A_mB_nO_3$ layer in a nitrogen atmosphere to crystallize said amorphous $A_mB_nO_3$ layer, thus forming said perovskite-type oxide layer having said granular structure,
    wherein A includes at least one of metals belonging to II-group or Pb;
    B includes at least one of metals belonging to IV-group; and
    m and n are positive values.

18. The method as set forth in claim 17, wherein said amorphous $A_mB_nO_3$ layer forming step is carried out by an electron cyclotron resonance chemical vapor deposition process.

* * * * *